(12) United States Patent
Reiter et al.

(10) Patent No.: US 9,093,836 B2
(45) Date of Patent: Jul. 28, 2015

(54) METHOD FOR CONTROLLING A TRANSISTOR AND CONTROL CIRCUIT

(75) Inventors: Tomas Manuel Reiter, Munich (DE); Juergen Kett, Friedrichshafen (DE); Bernhard Doemel, Seefeld (DE)

(73) Assignees: Infineon Technologies Austria AG, Villach (AT); ZF Friedrichshafen AG, Friedrichshafen (DE)

( * ) Notice: Subject to any disclaimer, the term of this patent is extended or adjusted under 35 U.S.C. 154(b) by 175 days.

(21) Appl. No.: 13/984,268

(22) PCT Filed: Dec. 20, 2011

(86) PCT No.: PCT/DE2011/050058
§ 371 (c)(1),
(2), (4) Date: Oct. 23, 2013

(87) PCT Pub. No.: WO2012/107010
PCT Pub. Date: Aug. 16, 2012

(65) Prior Publication Data
US 2014/0049866 A1 Feb. 20, 2014

(30) Foreign Application Priority Data
Feb. 7, 2011 (DE) .......... 10 2011 003 733

(51) Int. Cl.
*H03K 17/0812* (2006.01)
*H02H 3/20* (2006.01)
*H03K 17/082* (2006.01)
*H03K 17/18* (2006.01)
*G01R 31/02* (2006.01)

(52) U.S. Cl.
CPC ............. *H02H 3/20* (2013.01); *H03K 17/0828* (2013.01); *H03K 17/18* (2013.01); *G01R 31/025* (2013.01); *H03K 2217/0027* (2013.01)

(58) Field of Classification Search
CPC .......... H03K 17/082; H03K 17/08128; H03K 17/18; H03K 2217/0027; H02H 3/20
USPC ................. 327/108, 109, 389, 432, 434, 479; 361/91.1
See application file for complete search history.

(56) References Cited

U.S. PATENT DOCUMENTS

| | | | | |
|---|---|---|---|---|
| 7,183,835 B2* | 2/2007 | Sakata et al. | ................. | 327/434 |
| 7,295,412 B2* | 11/2007 | Sasaki et al. | ................. | 361/91.1 |
| 7,642,817 B2* | 1/2010 | Jasberg et al. | ................ | 327/108 |
| 8,451,045 B2* | 5/2013 | Yim et al. | ...................... | 327/392 |
| 8,633,755 B2* | 1/2014 | Kawamoto et al. | ........... | 327/309 |

(Continued)

FOREIGN PATENT DOCUMENTS

| | | |
|---|---|---|
| CN | 1638224 A | 7/2005 |
| DE | 19736356 A1 | 3/1999 |
| DE | 10040477 A1 | 3/2002 |
| DE | 69533383 T2 | 8/2005 |

(Continued)

*Primary Examiner* — Patrick O'Neill
(74) *Attorney, Agent, or Firm* — Slater & Matsil, L.L.P.

(57) ABSTRACT

A description is given of a method for the pulsed control of a transistor which has a control terminal and a load path. The load path of the transistor is connected in series with a load. A control circuit is provided for a transistor. In the method, the transistor is controlled with a control pulse of a first type, which has a first control level at least for a first time duration, before a control pulse of a second type, which has a second control level, which is higher in comparison with the first control level. A voltage across the load path of the transistor is evaluated and the pulsed control is terminated if the voltage across the load path exceeds a predefined threshold value.

19 Claims, 6 Drawing Sheets

(56) References Cited

U.S. PATENT DOCUMENTS

2004/0027762 A1 2/2004 Ohi et al.
2005/0146823 A1 7/2005 Sakata et al.
2008/0002325 A1 1/2008 Kato et al.
2011/0002073 A1 1/2011 Fukuda et al.

FOREIGN PATENT DOCUMENTS

| EP | 0361212 A2 | 4/1990 |
| EP | 0687066 A1 | 12/1995 |
| EP | 0844720 A2 | 5/1998 |

\* cited by examiner

METHOD FOR CONTROLLING A TRANSISTOR AND CONTROL CIRCUIT

This patent application is a national phase filing under section 371 of PCT/DE2011/050058, filed Dec. 20, 2011, which claims the priority of German patent application 10 2011 003 733.0, filed Feb. 7, 2011, each of which is incorporated herein by reference in its entirety.

TECHNICAL FIELD

The present invention relates to a method for the pulsed control of a transistor, in particular of a transistor used for switching an electrical load, and a control circuit for the transistor.

BACKGROUND

Transistors are widely used as electronic switches. Owing to the high switching frequencies with which transistors can be operated, transistors are not only suitable as "static" switches that are closed over a relatively long period of time, such as a few seconds, minutes or hours, but are also suitable for the clocked or pulsed control of loads.

Transistors controlled in a clocked or pulsed manner are used for example in driver circuits for inductive loads, such as, for example, in half-bridge or full-bridge drivers for electric motors, solenoid valves, etc. A further field of use is switching converters or switch-mode power supplies, in which a clocked control of a transistor serves for regulating the current consumption and thus for regulating output voltage.

In order to minimize conduction losses which can occur when the transistor is controlled in the on state, transistors used as switches are usually operated with a control voltage having a magnitude such that the transistor in normal operation is always operated in its linear region (ohmic region). In this context, "normal operation" means that there flows through the transistor a current which the transistor can carry permanently without the risk of destruction. However, if a short circuit occurs in the load controlled by the transistor, a high control voltage causes a very high current to flow through the transistor, which the transistor cannot permanently carry without the risk of destruction arising.

In order to detect such a short circuit it is known, in principle, to evaluate the current flowing through the transistor or a voltage drop across the load path of the transistor and to control the transistor in the off state, or to turn it off, if the presence of a short circuit is detected. On account of signal propagation times during the evaluation of the load path voltage or of the load current and on account of switching delays of the transistor, although the time duration during which a short-circuit current flows can be reduced, the high short-circuit current cannot be completely prevented. However, under certain circumstances, a short-circuit current that flows only for a very short duration already suffices to damage or even to destroy the transistor.

SUMMARY OF THE INVENTION

Embodiments of the present invention provide a method for the pulsed control of a transistor connected in series with a load, in which method the risk of damage to the transistor in the case of a short circuit of the load is reduced, and to provide a corresponding control circuit for a transistor.

One exemplary embodiment of the invention relates to a method for the pulsed control of a transistor which has a control terminal and a load path and the load path of which is connected in series with a load. This method provides for driving the transistor with a control pulse of a first type, which has a first control level at least for a first time duration, before a control pulse of a second time, which has a second control level, which is higher in comparison with the first control level. The method additionally comprises evaluating a voltage across the load path of the transistor and terminating the pulsed control if the voltage across the load path exceeds a predefined threshold value.

If, in this method, a short circuit occurs in the load, then the short circuit leads to a lower short-circuit current in the case where the transistor is controlled with a control pulse of the first type than in the case where the transistor is controlled with a control pulse of the second type. If the short circuit is already detected during the control of the transistor with the control pulse of the first type, such that the control is interrupted, then it is possible to avoid high short-circuit currents which would occur in the case of the transistor being controlled with control pulses of the second type. By contrast, if no short circuit is detected during the control with control pulses of the first type, then the further control of the transistor with control pulses of the second type helps to reduce the switching losses or conduction losses which would occur if the transistor were controlled exclusively with control pulses of the first type.

A further exemplary embodiment of the invention relates to a control circuit for controlling a transistor connected in series with a load. The control circuit is designed to control the transistor with a control pulse of a first type, which has a first control level at least for a first time duration, before a control pulse of a second type, which has a second control level, which is higher in comparison with the first control level; to evaluate a voltage across the load path of the transistor; and to terminate the pulsed control if the voltage across the load path exceeds a predefined threshold value.

BRIEF DESCRIPTION OF THE DRAWINGS

Exemplary embodiments of the invention are explained in greater detail below with reference to drawings. The drawings serve for elucidating the basic principle, and so only the features necessary for understanding the basic principle are illustrated. The drawings are not necessarily true to scale. In the drawings, identical reference signs designate identical features having the same meaning.

DETAILED DESCRIPTION OF ILLUSTRATIVE EMBODIMENTS

Figure 1:
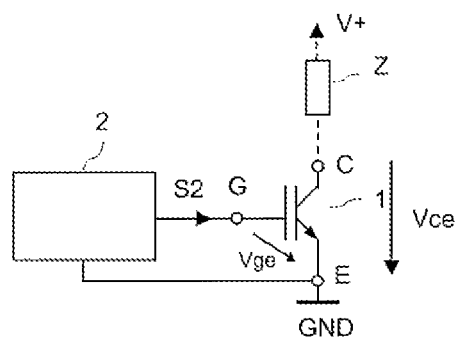
FIG. 1 schematically illustrates a circuit arrangement comprising a transistor connected in series with a load and comprising a control circuit for the transistor.

FIG. 1 schematically shows a circuit arrangement comprising a transistor connected in series with a load Z, and comprising a control circuit 2 for the transistor 1. The transistor 1 has a load path C-E and a control terminal G. In this case, the load path C-E of the transistor is connected in series with the load Z between terminals for positive supply potential V+ and a negative supply potential or reference potential GND. The control circuit 2 is connected to the control terminal G of the transistor 1 and generates a control signal S2 at the control terminal G of the transistor, wherein the transistor 1 is controlled in the on state (is switched on) or is controlled in the off state (is switched off) depending on the control signal S2.

The transistor 1 in accordance with FIG. 1 is realized as a MOS transistor, and specifically as an IGBT. The IGBT has a gate terminal G, a collector terminal C and an emitter terminal E. The load path of the IGBT runs between the collector terminal C and the emitter terminal E. The gate terminal G of the IGBT forms the control terminal thereof. The control signal S2 corresponds to the gate-emitter voltage Vge of the IGBT 1, wherein the IGBT 1 is in the on state if the control signal S2 or the control voltage Vge lies above a threshold value, and wherein the IGBT 1 is in the off state if the control signal S2 or the control voltage Vge lies below the threshold value.

It should be pointed out that the use of an IGBT as transistor should be understood merely as an example. Instead of an IGBT, it is also possible to use any other MOS transistor, such as, for example, an n-channel MOSFET or a p-channel MOSFET. The control of an n-channel MOSFET corresponds to that of an IGBT. A p-channel MOSFET differs from an n-channel MOSFET and an IGBT in that, instead of a positive control voltage, a negative control voltage is required to control the p-MOSFET in the on state. However, the basic principles explained below apply to the use of a p-MOSFET as transistor in a corresponding manner. In the circuit arrangement in accordance with FIG. 1, the transistor 1 serves for the clocked or pulsed switching of the load Z or for the clocked or pulsed application of the supply voltage present between the supply connecting terminals to the load Z. The supply voltage is present at the load Z—approximately completely—here in each case when the transistor 1 is switched on. For this purpose, the control circuit 2 generates a pulsed control signal S2 for the transistor 1.

Figure 2:
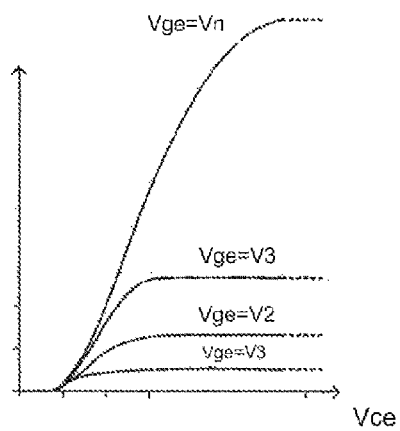
FIG. 2 illustrates a typical set of characteristic curves of a power MOS transistor.

FIG. 2 illustrates a typical set of characteristic curves of a MOS transistor, in particular of an IGBT. FIG. 2 illustrates the dependence of a load current Ic flowing through the transistor 1 on a load path voltage Vce present across the load path C-E of the transistor for different control voltages or for different levels of the control signal S2. Each of these characteristic curves has a linear region (ohmic region), in which the load current Ic firstly increases as the load path voltage Vce increases, and an active region, in which the load current Ic increases only slightly or less than proportionally as the load path voltage Vce increases. The active region is also designated as saturation region in the case of a transistor 1 realized as a MOSFET, and is also designated as desaturation region in the case of a transistor 1 realized as an IGBT. The values of the load path voltages at which the individual characteristic curves "kink," i.e., at which the saturation region begins, are all the higher, the higher the control voltage.

In order to reduce conduction losses it is desirable to operate the transistor 1 over the entire rated current range in the linear region (ohmic region), i.e., in the saturation region in the case of an IGBT. The rated current range is the current range within which the load current Ic is permitted to lie in normal operation, i.e., in the case of a fault-free load, without there being the risk of destruction for the transistor. This can be achieved by using, for controlling the transistor 1 in the on state, a control voltage Vge that lies far above the threshold value. The control voltage is, for example, 10 V or more (typically in the case of MOSFETs), or even 15 V or more (typically in the case of IGBTs). The curve designated by Vge=Vn in FIG. 2 illustrates the characteristic curve of a transistor for such a high control voltage. The exclusive use of such a high control voltage for controlling the transistor 1 in the on state entails the risk, however, of very high short-circuit currents flowing through the transistor 1 in the event of a short circuit of the load Z.

The load Z can be an arbitrary electrical load, and can in particular also contain further parts of a driver circuit, such as, e.g., a transistor (not illustrated) that supplements the transistor 1 to form a half-bridge, or further transistors (not illustrated) that supplement the transistor 1 to form a full-bridge.

Figure 3:
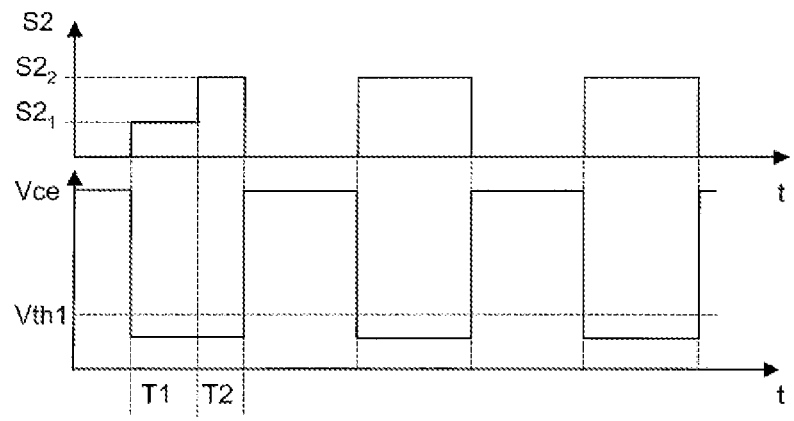
FIG. 3 illustrates an exemplary embodiment of the method according to the invention on the basis of signal profiles in fault-free operation.
Figure 4:
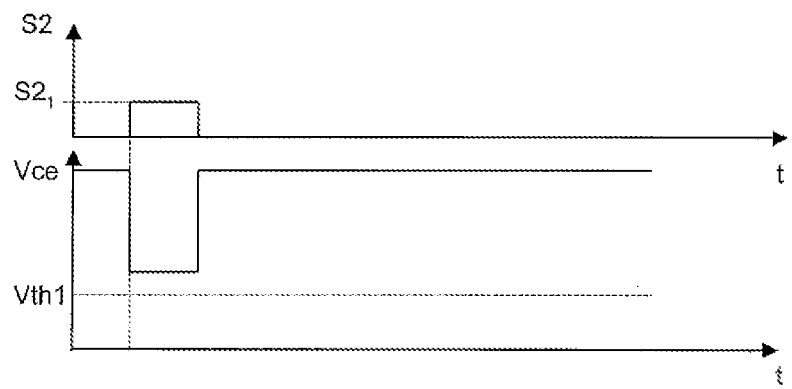
FIG. 4 illustrates the method in accordance with FIG. 3 in the event of a short circuit of the load.

FIGS. 3 and 4 illustrate a first exemplary embodiment of a method according to the invention for controlling a transistor connected in series with a load, such as, for example, the transistor 1 in accordance with FIG. 1, in normal operation (FIG. 3) and in the fault situation (FIG. 4). A fault situation is present when a short circuit occurs in the load Z before or during the clocked control of the transistor.

FIGS. 3 and 4, in each case, show temporal profiles of the control signal S2 and of the load path voltage Vice of the transistor 1. In the method illustrated, a pulsed or clocked control of the transistor is effected by the provision of temporally successive control pulses. The control signal S2 can be, in particular, a pulse-width-modulated (PWM) signal, such that the duration of the individual control pulses and the time interval between two successive control pulses can vary.

The method uses two different types of control pulses, which differ with regard to their signal level, namely a control pulse of a first type and a control pulse of a second type. The control pulse of the first type has a first control level $S2_1$ at least for a first time duration T1, and the control pulse of the second type has a second control level $S2_2$, which is higher in comparison with the first control level $S2_1$. FIG. 3 illustrates a control sequence with one control pulse of the first type and two subsequent control pulses of the second type. In this case, FIG. 3 shows two possible variants for the control pulse of the first type: a first variant (illustrated in a dashed manner), in which the control pulse of the first type assumes the first control level $S2_1$ during its entire time duration, and a second variant, in which the control pulse of the first type assumes the first signal level $S2_1$ during a first time duration T1 and subsequently assumes the second signal level $S2_2$ for the remaining time duration of the control pulse.

In the method, the load path voltage Vce is monitored or evaluated during the duration of the individual control pulses. Depending on whether an evaluation circuit that performs the monitoring and evaluation of the load path voltage Vce is implemented as an analog circuit or as a digital circuit, the load path voltage Vce can be evaluated during the control pulses permanently (in the case of an analog circuit) or at regular or irregular time intervals (in the case of a digital circuit). In this case, the clocked or pulsed control of the transistor is interrupted if it is detected that the load path voltage Vce or the absolute value of the load path voltage Vce lies above a threshold value, which is designated by Vth1 in FIG. 3. Such exceeding of the threshold value Vth1 does not occur during normal operation illustrated in FIG. 3. By contrast, in the case of the fault situation illustrated in FIG. 4, the load path voltage exceeds the threshold value Vth1 in the case of a control pulse of the first type, such that the control is actually interrupted during the control pulse and a further control of the transistor 1 is prevented.

In connection with the time profiles illustrated in FIGS. 3 and 4 and also in connection with the time profiles that will be illustrated below, it should be pointed out that the signal profiles illustrated are idealized or illustrated schematically, such that transient processes or time delays possibly present between edges of the control signal S2 and resultant edges of the load path voltage Vce are not illustrated in the Figures.

A control pulse of the first type has—at least during the first time duration T1—a lower control level than a control pulse of the second type. If a short circuit occurs in the load, then a lower short-circuit current flows in the case where the transistor 1 is controlled with a control pulse of the first conduction type than in the case where the transistor 1 is controlled with a control pulse of the second type. If a short circuit is already detected during a control pulse of the first type, as is illustrated in FIG. 4, then the control is interrupted and no further control pulses are generated. In particular, no control pulses of the second type are generated, in the case of which a higher short-circuit current would flow in the event of a short circuit. By contrast, if no short circuit is detected during a control pulse of the first type, then the further control of the transistor 1 can be effected with control pulses of the second type, by means of which the transistor is turned on further, such that here the conduction resistance is lower. Such a scenario is illustrated in FIG. 3.

The first control level $S2_1$ for the control pulses of the first conduction type lies in the range of between 5 V and 8 V, for example, while the second control level $S2_2$ lies in the range of between 10 V and 15 V, for example.

In the method, a first control pulse can be generated for example in each case at the beginning of a pulsed control of the switch 1. The beginning of a pulsed control is present, for example, when the transistor 1 previously has not been controlled or not been controlled for a relatively long time. In this context, "not being controlled for a relatively long time" means a control phase which, for example, is longer than the pause between two control pulses of a control sequence, such as, for example, the control sequence illustrated in FIG. 3. A relatively long control pause is present, for example, when the transistor 1 is not controlled in the on state for a time duration corresponding to more than 5 times, 10 times, or 100 times the time duration between two directly successive control pulses of the control sequence or the time duration of a control cycle during the clocked control. The duration of a control cycle corresponds to the time interval between the beginning of two directly successive control pulses during the clocked control.

A further exemplary embodiment provides for generating, at the beginning of a control, a plurality of successive control pulses of the first type, such as, for example, a number of between 2 and 5 control pulses of the first type.

A further exemplary embodiment provides for generating control pulses of the first type at regular or irregular time intervals during a sequence of control pulses, such as, for example, generating every n-th control pulse as a control pulse of the first type, where n is an arbitrary integer greater than 2 and in particular greater than 10 or even greater than 100.

A further exemplary embodiment provides for generating control pulses of the first type during a clocked control depending on a control signal or test signal. The control signal can be fed to a control circuit that generates the control pulses for the transistor 1 from outside, for example, by a user or by a monitoring circuit.

Figure 5:
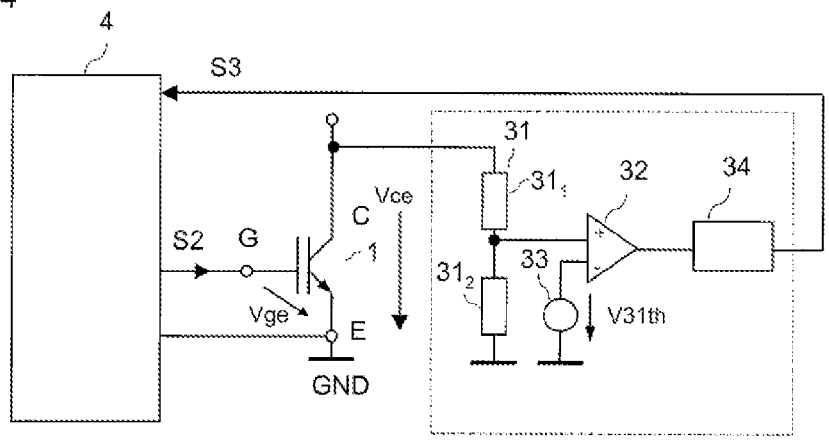
FIG. 5 illustrates a first exemplary embodiment of the control circuit having an evaluation circuit for a load path voltage of the transistor.

FIG. 5 shows an exemplary embodiment of a control circuit 2. This control circuit 2 comprises a measuring circuit 3 and an evaluation and control signal generating circuit 4. The measuring circuit 3 is designed to measure or evaluate the load path voltage Vce and to make available a measurement or evaluation signal S3 dependent on this evaluation. In the example illustrated, the measuring circuit 3 comprises a voltage divider 31 having voltage divider resistors $31_1$, $31_2$, the voltage divider being connected in parallel with the load path C-E of the transistor 1. The center voltage V31 that can be tapped off at the voltage divider is proportional to the load path voltage Vce. A comparator 32 compares the voltage V31 with a threshold value V31th, which represents the first threshold value Vth1 illustrated in FIG. 1. In the example illustrated, a high level is present at the output of the comparator 32 if the voltage V31 dependent on the load path voltage Vce exceeds the threshold value V31th. The threshold value V31th is generated by a reference voltage source 33.

Optionally, a low-pass filter, such as an RC element, for example, is connected downstream of the comparator 32 and subjects the output signal of the comparator 32 to low-pass filtering. In this case, a high level of the measurement signal S3 is forwarded to the evaluation and control signal generating circuit 4 only when a high level is present at the output of the comparator 32 for a time duration that is longer than a filter time constant, for example, an RC time constant, of the low-pass filter 34. This avoids a situation where voltage spikes across the load path Vce, which can occur during transient processes after the transistor 1 has been switched on or switched off, are erroneously detected as a fault or short circuit.

Figure 6:
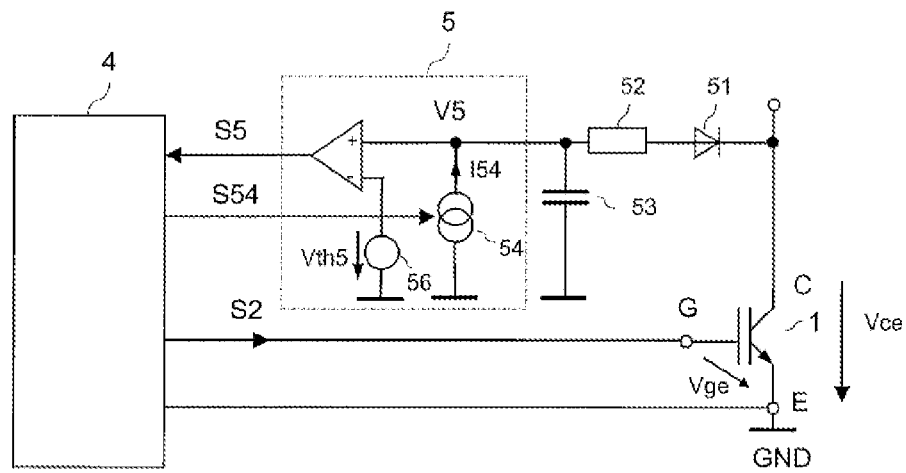
FIG. 6 illustrates a further exemplary embodiment of the control circuit having an evaluation circuit for a load path voltage of the transistor.

FIG. 6 illustrates a further exemplary embodiment of a control circuit 2 having a measuring circuit 5 and an evaluation and control signal generating circuit 4. In this exemplary embodiment, the measuring circuit 5 comprises a capacitor 53, which is connected in parallel with the load path C-E via a diode 51 and an optional resistor 52. A controllable current source 54 is connected in parallel with the capacitor 53, provides a charging current or a discharging current for the capacitor 53 and is controlled by a control signal S54 provided by the evaluation and control signal generating circuit 4. A voltage V5 across the capacitor 53 is compared with a reference voltage Vth5 by means of a comparator 55, the reference voltage representing the first threshold value Vth1. A measurement or evaluation signal S5 is available at the output of the comparator 55 and assumes a high level or a low level depending on whether the voltage V5 across the capacitor 53 lies above or below the threshold value Vth5. In the example illustrated, a high level represents a fault situation, that is to say a situation in which the load path voltage Vce lies above the first threshold value, represented by the reference value Vth5 in FIG. 6. This reference value or this reference voltage Vth5 is generated by a reference voltage source 56.

The functioning of the measuring circuit 5 illustrated in FIG. 6 is explained below. For this purpose it should firstly be assumed that the transistor 1 is controlled in the off state, such that the entire supply voltage is dropped across the load path C-E of the transistor 1. During the control of the transistor 1 in the off state, the capacitor 53 is discharged via the current source 54 until a voltage V5 across the capacitor 53 assumes the value of almost zero. If the transistor 1 is subsequently controlled in the on state, then the capacitor 53 is charged by the controllable current source 54, as a result of which a voltage V5 across the capacitor 53 rises. In this case, the voltage across the capacitor 53 is limited by means of the diode 51 and the optional resistor 52 and the load path C-E of the transistor 1, to be precise to a value which corresponds approximately to the voltage Vce across the load path of the transistor 1 plus the forward voltage of the diode 51. If a short circuit of the load is present, and if a voltage drop Vce across the load path C-E of the transistor 1 is correspondingly large, then the voltage V5 across the capacitor 53 can also rise to a corresponding extent. If the voltage V5 across the capacitor 53 rises to a value lying above the threshold value Vth5, then the measurement and evaluation signal S5 indicates a fault. Correspondingly, the measurement and evaluation signal indicates no fault if the voltage V56 across the capacitor 53 is limited to a value below the threshold value Vth5. This is tantamount to the sum of the forward voltage of the diode 51 and the load path voltage Vce lying below the threshold value Vth5.

An evaluation of the measurement and evaluation signal S5 within the evaluation and control signal generating circuit 4 is effected only during control pulses, that is to say during those time durations during which the capacitor 53 is charged via the controlled current source. Since the capacitor 53 is always discharged during the switched-off durations of the transistor 1 (typically to 0 V), the voltage during the switched-off durations is always lower than the threshold value Vth5. Consequently, no fault can be indicated during the switched-off duration. The control signal S54 of the current source 54 can be derived, for example, from the control signal S2 for the transistor 1. The control signal S54 is chosen, for example, such that the current source 54 is controlled during the switched-off durations of the transistor 1 such that it generates a discharging current, and that the current source 54 is controlled during the switched-off durations of the transistor 1 such that it generates a charging current. A discharging current is in this case a current I54 that flows counter to the current direction indicated in FIG. 6, and a charging current is in this case a current I54 that flows in the current direction indicated in FIG. 6. The absolute values of the charging current and of the discharging current can be identical, but can also differ. Controllable or switchable current sources which—like the current source 54 in accordance with FIG. 6—supply a charging current (positive current) or discharging current (negative current) according to a control signal are known in principle, and so further explanations in this respect can be dispensed with.

Figure 7:
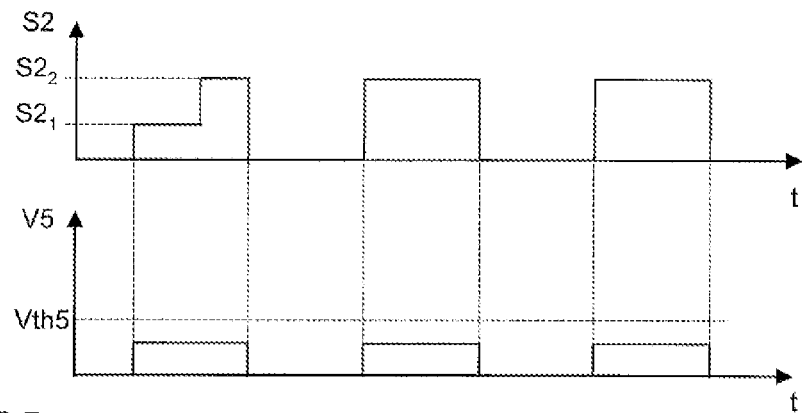
FIG. 7 illustrates a further exemplary embodiment of a method according to the invention in a fault-free case.
Figure 8:
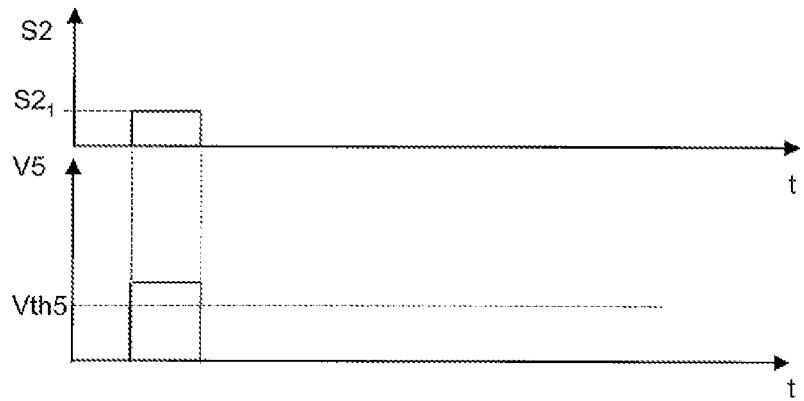
FIG. 8 illustrates the method in accordance with FIG. 7 in the event of a short circuit of the load.

In order to clarify the functioning of the control circuit illustrated in FIG. 6, FIGS. 7 and 8 show temporal profiles of the control signal S2 and of the voltage V5 across the capacitor 53 for normal operation (FIG. 7) and a fault situation (FIG. 8). In normal operation, in which, in the example illustrated in FIG. 7, firstly a control pulse of the first type and then control pulses of the second type are generated, the voltage V5 remains below the threshold value Vth5 both during the control pulse of the first type and during the control pulses of the second type. As a result, the measurement and evaluation signal S5 (see FIG. 6) remains at a signal level (a low level, in the example in accordance with FIG. 6), that indicates fault-free operation or normal operation.

In the fault situation, illustrated in FIG. 8, the voltage V5 across the capacitor 53 rises above the threshold value Vth5 already during the control pulse of the first type, with the result that the presence of a fault is deduced, the control is interrupted and a further control does not occur. The fault is indicated by a fault signal level of the measurement and evaluation signal S5. In the exemplary embodiment in accordance with FIG. 6, the fault signal level is a high level of the measurement and evaluation signal S5.

Even though the signal profiles of the voltage V5 in FIGS. 7 and 8 are illustrated such that the signal profiles change directly when control pulses of the control signal S2 begin, it should be pointed out that such a change in the voltage V5 after a switch-on of the transistor 1 can take place with a time delay, to be precise in a manner governed by the RC element formed by the capacitor 53 and the optional resistor 52.

Figure 9:
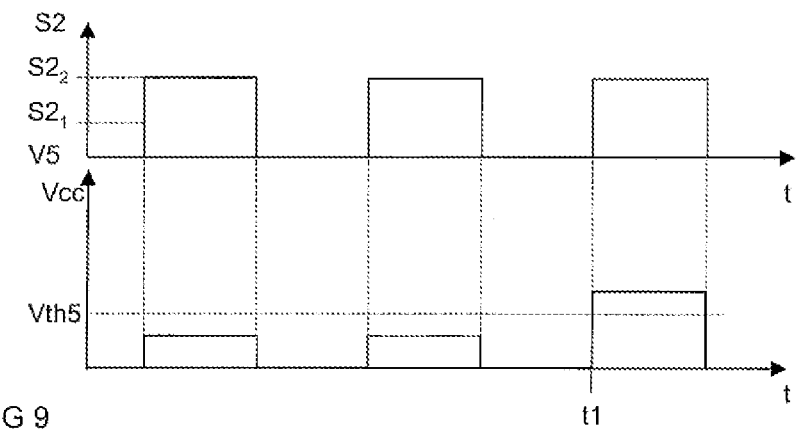
FIG. 9 illustrates a method in which a short circuit occurs during a clocked control with control pulses of a second type.

As already mentioned above, the load path voltage Vce is evaluated during all control pulses, i.e., during the control pulses of the first type and during the control pulses of the second type. In this case, a control of the transistor 1 is also interrupted when such a fault is detected during control pulses of the second type. Such a scenario is illustrated in FIG. 9. FIG. 9 shows a sequence of control pulses of the second type. In this case, a fault occurs at an instant T1, such that during a subsequent control pulse the load path voltage Vce rises above the threshold value Vth1.

Figure 10:
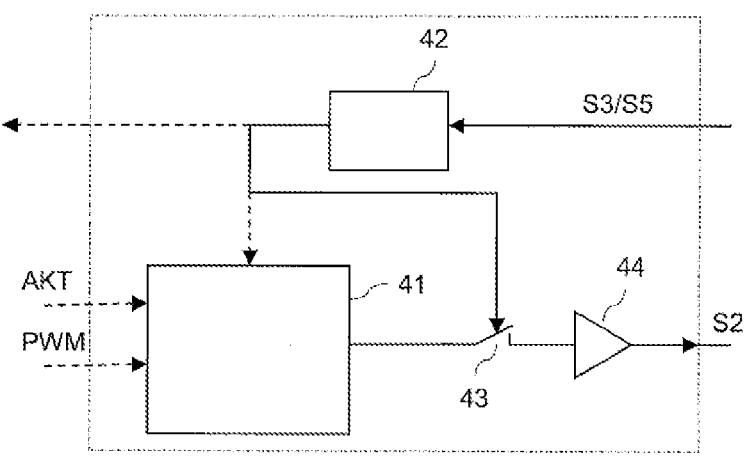
FIG. 10 illustrates an exemplary embodiment of an evaluation and control signal generating circuit of the control circuit.

FIG. 10 shows an exemplary embodiment of the evaluation and control signal generating circuit, to which the measurement or evaluation signal S3 or S5 is fed and which generates the control signal S2 for the transistor. This evaluation and signal generating circuit 4 has a control signal generating circuit 41, an optional driver circuit 44 connected downstream of the control signal generating circuit 41, and an evaluation circuit 42. The evaluation circuit 42 is designed to evaluate the measurement signal S3 or S5 during the switched-on durations of the transistor 1. For this purpose, the measurement signal S3 or S5 and the control signal S2 are fed to the evaluation circuit 42. If the signal level of the measurement signal S3 or S5 indicates a fault during the switched-on duration of the transistor 1, which, in the measuring circuits in accordance with FIGS. 5 and 6, is the case when the measurement signals S3 and S5 have a high level, then the control circuit 4 prevents a further control of the transistor. For this purpose, the circuit 4 has an interruption element, which is illustrated schematically as switch 43 in FIG. 10, and which is connected between the control signal generating circuit 41 and the optional driver circuit 44. The switch 43 is controlled by a fault signal made available at the output of the evaluation circuit 42, the fault signal indicating the presence of a fault or the non-presence of a fault depending on the signal level. Optionally, the fault signal S42 is forwarded to a central control circuit (not illustrated) and/or forwarded to the control signal generating circuit 41.

Figure 11:
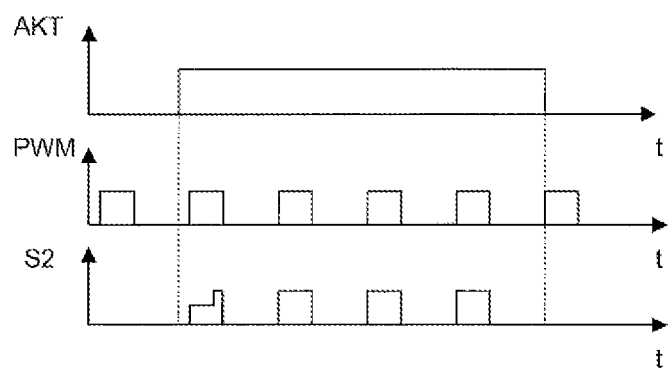
FIG. 11 illustrates the functioning of an example of the evaluation and control signal generating circuit in accordance with FIG. 10.

The control signal generating circuit 41 is designed to generate the control signal S2, using one of the principles explained above, as a sequence of control pulses of the first type and of the second type. One exemplary embodiment provides for a pulse-width-modulated signal PWM (illustrated in a dashed manner in FIG. 10) and an activation or enable signal AKT (likewise illustrated in a dashed manner in FIG. 10), to be fed to the control signal generating circuit 41 by an external control circuit, such as, for example, a microcontroller (not illustrated). Depending on these two signals, the control signal generating circuit 41 generates the control signal S2 for the transistor 1. In this case, one exemplary embodiment provides for the control signal generating circuit 41 to generate, during a time duration during which the activation signal AKT has a predefined signal level—such as, for example, a high level—, control pulses of the control signal S2 whose duration corresponds to the duration of the control pulses of the pulse-width-modulated signal PWM. In this case, provision is furthermore made for a first signal pulse after the presence of the predefined level of the activation signal AKT to be a control pulse of the first type or for two or more control pulses after the presence of the predefined level of the activation signal AKT to be control pulses of the first type. Such a procedure is illustrated schematically in FIG. 11, which illustrates temporal profiles of the activation signal AKT, of the pulse-width-modulated signal PW and of the control signal S2. In this case, the control pulses of the first type each have the first control level $S2_1$ for the first time duration T1 and then the second control level $S2_2$. In the example illustrated in FIG. 11, the first signal pulse after an activation level of the activation signal is in each case a signal pulse of the first type.

Figure 12:
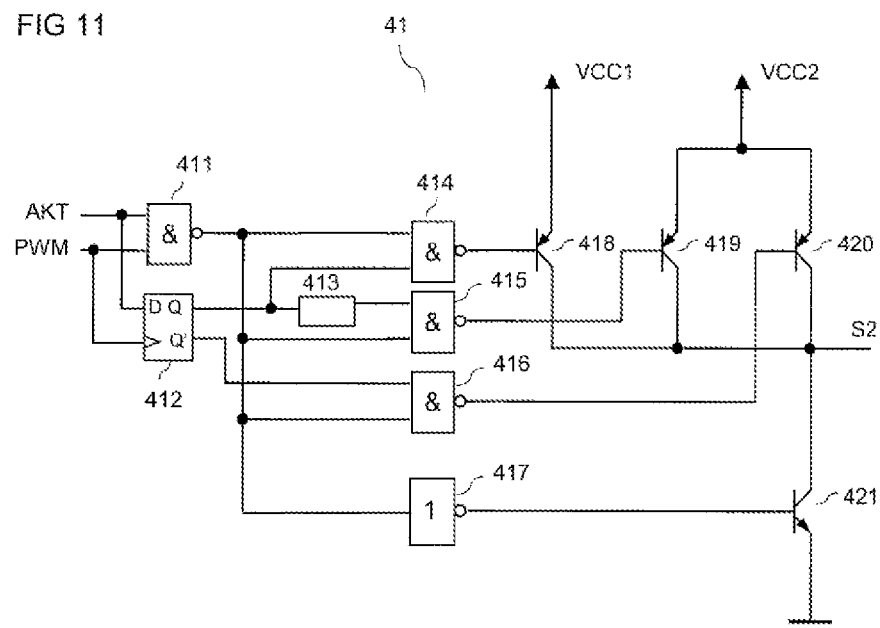
FIG. 12 illustrates an exemplary embodiment of a control signal generating circuit of the control circuit.

FIG. 12 shows an exemplary embodiment of a control signal generating circuit 41 having the functionality explained above with reference to FIG. 11.

This control signal generating circuit has an output or driver stage realized as a half-bridge circuit having one low-side switch 421 and three high-side switches 418, 419, 420. The switches are realized as bipolar transistors in the example illustrated. However, this is merely an example. These switches could correspondingly also be realized as MOS transistors, such as MOSFET or IGBT or as JFET. Moreover, in the circuit in accordance with FIG. 12, the high-side transistors 418-420 are transistors complementary to the low-side transistor 421. Specifically, in the example illustrated, the high-side transistors 418-420 are PNP transistors, while the low-side transistor is an NPN transistor. It goes without saying that the high-side transistors 418-420 and the low-side transistor 421 could also be of the same conduction type, which should then be taken into account suitably when generating the control signals for these transistors.

Load paths (collector-emitter paths) of the high-side transistors 418-420 are connected in series with the load path of the low-side transistor 421. A circuit node common to the load paths of the high-side transistors 418-420 and the load path of the low-side transistor 421 forms an output of the driver stage, at which the control signal S2 is available.

A first 418 of the high-side transistors is connected between a terminal for a first supply potential Vcc1 and the low-side transistor 421 or the output, and a second 419 and a third 420 of the high-side transistors are connected between a terminal for a second supply potential Vcc2 and the low-side transistor 421 or the output. That terminal of the low-side transistor 421 which faces away from the output is at a reference potential. In this circuit, the first supply potential Vcc1 represents the first (lower) signal level of the control signal S2, and the second supply potential Vcc2 represents the second (higher) signal level of the control signal S2. In this circuit, a first signal level of the control signal S2 is generated if the first high-side transistor 418 is in the on state and the remaining transistors 419, 420, 421 are in the off state. A second control signal level of the control signal S2 is generated if one of the second and third high-side switches 419, 420 is in the on state and the low-side switch 421 is in the off state. The transistor to be controlled (1 in FIG. 6) is controlled in the on state in each case when a first or second control signal level of the control signal S2 is present. Control of the transistor in the off state or a switch-off level of the control signal S2 is present if the low-side transistor 421 is in the on state and the high-side transistors 418, 419, 420 are in the off state. The control signal generating circuit illustrated in FIG. 12 functions for an n-conducting transistor 1, but can also easily be modified for the control of a p-conducting transistor.

The high-side transistors 418-420 of the output stage are in each case controlled via logic gates, which are realized as NAND gates in the example. In this case, a first gate 414 controls the first high-side transistor 418, a second gate 415 controls the second high-side transistor 419 and a third gate 416 controls the third high-side transistor 420.

The control signal generating circuit additionally comprises an input gate 411, to which the activation signal AKT and the pulse-width-modulated signal PWM are fed, a storage element 412, which is realized as a flip-flop in the example and to which likewise the activation signal AKT and the pulse-width-modulated signal PWM are fed, an inverter 417 connected between the output of the input gate 411 and the control terminal of the low-side transistor 421, and a delay element 413 connected between a first output (the non-inverting output) of the flip-flop 412 and an input of the second gate 415.

In the example illustrated, the flip-flop 412 is a D-type flip-flop, at the data input D of which the activation signal AKT is present and at the clock input of which the pulse-width-modulated (PWM) signal PWM is present. In the example illustrated, the flip-flop is a negative-edge-triggered flip-flop. This flip-flop is set with the falling edge of the first signal pulse of the pulse-width-modulated signal PWM after the presence of an activation level of the activation signal AKT.

Hereinafter, "the first signal pulse of the PWM signal PWM" is the first signal pulse after the presence of the activation level of the activation signal AKT. At the beginning of this first signal pulse, the flip-flop 412 is not yet set. In this case, the third high-side switch 420 is turned off or controlled in the off state via the third gate 416, to which the signal at the inverting output of the flip-flop 412 and the output signal of the input gate 411 are fed, and remains turned off until the flip-flop is set. At the beginning of the first signal pulse, the first high-side transistor 418 is controlled in the on state by the first gate 414, to which the signal at the non-inverting output of the flip-flop 412 and the output signal of the input gate 411 are fed. The control signal S2 assumes the first signal level as a result.

After a time duration predefined by the delay element 413 has elapsed, the second high-side transistor 419 is also controlled in the on state, to be precise by means of the second gate 415, to which the signal at the non-inverting output of the flip-flop 412 is fed via the delay element 413 and the output signal of the input gate 411 is fed. The control signal S2 assumes the second control signal level as a result. The low-side transistor 421 remains turned off during the control of the high-side transistors in the on state. The duration during which the control signal S2 assumes the first control signal level is predefined by the delay time of the delay element 413.

After the first signal pulse, and thus after the setting of the flip-flop, the first and second high-side transistors 418, 419 remain turned off, and only the third high-side transistor 420 is controlled in the on state, to be precise during the further signal pulses of the PWM signal PWM. The low-side switch 421 is controlled in the on state—and the high-side switches 418-420 are controlled in the off state—in each case when the activation signal AKT or the PWM signal has a deactivation level or switch-off level. The flip-flop 412 is reset with the first signal pulse of the PWM signal PWM after the end of the activation level of the activation signal AKT. If the activation signal AKT then assumes an activation level again at a later point in time, a first signal pulse of the control signal S2 is generated again in the event of a first signal pulse of the pulse-width-modulated signal PWM.

In the case of the control signal generating circuit 41 in accordance with FIG. 12, exactly one first signal pulse of the control signal is generated with the first signal pulse of the pulse-width-modulated signal PWM after an activation level of the activation signal AKT. A further exemplary embodiment of this control signal generating circuit provides for a plurality of first signal pulses to be generated after an activation level of the activation signal AKT. This can be achieved by a counter being used instead of the flip-flop 412, which counter, after the beginning of an activation level of the activation signal AKT, counts the signal pulses of the pulse-width-modulated signal PWM and leaves the third high-side switch 420 turned off via the gate 416 and activates only the first and second high-side switches 418, 419, in order to generate a first signal pulse, until a predefined number of signal pulses of the pulse-width-modulated signal PWM is reached.

Figure 13:
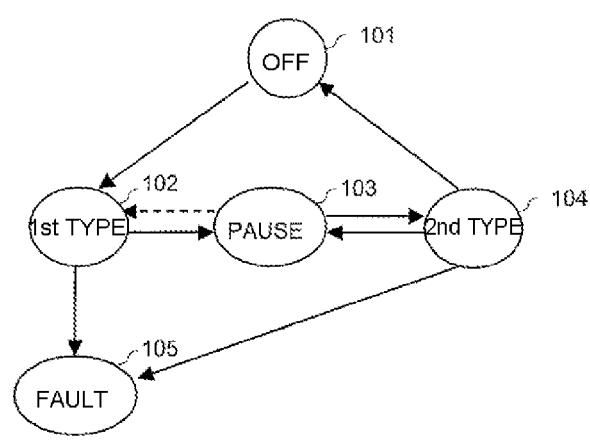
FIG. 13 illustrates the functioning of the control circuit on the basis of a state diagram.

FIG. 13 illustrates in summary the functioning of the control circuit 2 explained above, on the basis of a state diagram. In FIG. 13, an off state is designated by 101, in which state the transistor 1 is controlled in the off state. At the beginning of a pulsed or clocked control of the transistor 1, the control circuit assumes a second state 102, in which a control pulse of the first type is generated. The beginning of a pulsed control can be signaled, for example, by the activation signal explained with reference to FIG. 10. While a control pulse of the first type is generated, the load path voltage Vce of the transistor 1 is simultaneously evaluated, the control circuit undergoing transition to a fault state 105 if a fault is detected during evaluation of the load path voltage Vce. If no such fault is detected, the control pulse is maintained for a pre-defined time duration and there then follows a pulse pause, represented as state 103, until a next control pulse. The next control pulse can again be a control pulse of the first type. In this regard, one exemplary embodiment provides for generating a number of control pulses of the first type after a beginning of the control, i.e., after the off state 101 commences. However, the control pulse after a first control pulse of the first type can also be a control pulse of the second type. A control pulse of the second type is generated in the state 104 illustrated in FIG. 13. If a fault is detected during the presence of a control pulse of the second type, then the control circuit likewise undergoes transition to the fault state 105.

Proceeding from the state 104 in which control pulses of the second type are generated, the control circuit can again undergo transition to the off state 101. An end of the control, i.e., a beginning of the off state, is indicated—in the same way as, for example, the beginning of a pulsed control—by the activation signal AKT in accordance with FIG. 10.

If a fault was detected, the control circuit can remain permanently in the fault state 105. However, a further exemplary embodiment provides for the control circuit 2 to undergo transition from the fault state to the off state 101, such that a renewed control is possible. In this case, one example provides for counting fault events, i.e., transitions of the control circuit to the fault state 105, and for leaving the control circuit permanently in the fault state—in which control of the transistor 1 is not possible—if a predefined number of fault events has occurred. In this case, one example provides for leaving the control circuit permanently in the fault state 105 if the predefined number of fault events occurred during a pre-defined number of control pulses. Earlier fault events can thereby be "deleted."

Finally, it should be pointed out that features which have been explained in connection with one exemplary embodiment can also be combined with features of other exemplary embodiments, to be precise even if this has not been explicitly mentioned above.

The invention claimed is:

1. A method for pulsed control of a transistor which has a control terminal and a load path that is connected in series with a load, the method comprising:
    controlling the transistor with a control pulse of a first type, that has a first control level at least for a first time duration before a control pulse of a second type that has a second control level, the second control level being higher than the first control level;
    evaluating a voltage across the load path of the transistor; and
    terminating the pulsed control when the voltage across the load path exceeds a predefined threshold value.

2. The method as claimed in claim 1, wherein the control pulse of the first type has the second control level after the first time duration.

3. The method as claimed in claim 1, wherein there is a time interval between the control pulse of the first type and the control pulse of the second type.

4. The method as claimed in claim 1, comprising generating a plurality of control sequences, each control sequence having a plurality of control pulses, wherein a control pulse of the first type is generated at the beginning of each control sequence.

5. The method as claimed in claim 1, comprising generating a plurality of control sequences, each control sequence having a plurality of control pulses, wherein a plurality of control pulses of the first type are generated at the beginning of each control sequence.

6. The method as claimed in claim 1, wherein a control pulse of the first type is generated at regular intervals.

7. The method as claimed in claim 1, wherein a control pulse of the first type is generated depending on a test signal.

8. The method as claimed in claim 1, wherein a control permanently ceases after a termination of the control.

9. The method as claimed in claim 1, further comprising restarting control after a termination, wherein a first control pulse after the restarting of control is a control pulse of the first type.

10. The method as claimed in claim 9, further comprising counting a number of terminations and permanently interrupting the control if a predefined number of terminations is reached.

11. The method as claimed in claim 10, wherein the control is permanently interrupted if the predefined number of terminations occur during a predefined number of control pulses.

12. The method as claimed in claim 9, wherein the control is permanently interrupted if the control is terminated during the first control pulse after the beginning of a renewed control.

13. A control circuit for the pulsed control of a transistor connected in series with a load, wherein the control circuit is configured:
    to control the transistor with a control pulse of a first type that has a first control level at least for a first time duration, before a control pulse of a second type, which has a second control level, the second control being higher than the first control level;
    to evaluate a voltage across a load path of the transistor; and
    to terminate the pulsed control when the voltage across the load path exceeds a predefined threshold value.

14. The control circuit as claimed in claim 13, wherein the control circuit is configured to generate the control pulse of the first type with the second control level after the first time duration.

15. The control circuit as claimed in claim 13, wherein the control circuit is configured to generate a plurality of control sequences, each control sequence having a plurality of control pulses, wherein a control pulse of the first type is generated at the beginning of each control sequence.

16. The control circuit as claimed in claim 13, wherein the control circuit is configured to generate a plurality of control sequences, each control sequence having a plurality of control pulses, wherein a plurality of control pulses of the first type are generated at the beginning of each control sequence.

17. The control circuit as claimed in claim 13, wherein the control circuit is configured to generate a control pulse of the first type at regular intervals.

18. The control circuit as claimed claim 13, wherein the control circuit is configured to generate a control pulse of the first type depending on a test signal.

19. The control circuit as claimed claim 13, wherein the control circuit is configured to permanently prevent a control after a termination of the control.

* * * * *